US005619123A

United States Patent [19]

Okamura

[11] Patent Number: 5,619,123

[45] Date of Patent: Apr. 8, 1997

[54] POWER SUPPLY CIRCUIT FOR NON-THRESHOLD LOGIC CIRCUIT

[75] Inventor: Hitoshi Okamura, Tokyo, Japan

[73] Assignee: NEC Corporation, Tokyo, Japan

[21] Appl. No.: 533,835

[22] Filed: Sep. 25, 1995

[30] Foreign Application Priority Data

Oct. 3, 1994 [JP] Japan .................................... 6-238801

[51] Int. Cl.[6] ................................ G05F 3/08; G05F 3/02; H03K 19/013; H03K 19/086

[52] U.S. Cl. ............................ 323/312; 326/33; 327/540

[58] Field of Search ..................................... 323/312, 281, 323/282; 326/33; 327/538, 540, 541, 543, 78, 80, 143; 307/443, 454, 455, 456

[56] References Cited

U.S. PATENT DOCUMENTS

| | | | |
|---|---|---|---|
| 5,089,724 | 2/1992 | Chuang et al. | 307/454 |
| 5,126,597 | 6/1992 | Usami et al. | 307/454 |
| 5,160,857 | 11/1992 | Barre | 307/446 |
| 5,187,391 | 2/1993 | Kamase | 307/454 |
| 5,341,042 | 8/1994 | Chen | 307/446 |

FOREIGN PATENT DOCUMENTS

| | | |
|---|---|---|
| 0584471 | 3/1994 | European Pat. Off. . |
| 59-115618 | 7/1984 | Japan . |
| 4-39805 | 4/1992 | Japan . |
| 4-39806 | 4/1992 | Japan . |

*Primary Examiner*—Peter S. Wong
*Assistant Examiner*—Bao Q. Vu
*Attorney, Agent, or Firm*—Foley & Lardner

[57] ABSTRACT

A power supply circuit for a non-threshold logic (NTL) circuit including a plurality of NTL gate circuits, includes a monitoring circuit, a reference circuit and a comparing and regulating circuit. The monitoring circuit outputs a monitor voltage substantially proportional with a first factor to a voltage variation between an NTL lower voltage on an NTL higher power supply line and an NTL higher voltage on an NTL higher power supply line. The reference circuit outputs a reference voltage substantially proportional with a second factor to the voltage variation. The comparing and regulating circuit compares the monitor voltage from the monitoring circuit and the reference voltage from the reference circuit, and regulates the NTL lower voltage in accordance with the comparing result such that the NTL lower voltage is equal to a predetermined voltage.

19 Claims, 5 Drawing Sheets

POWER SUPPLY CIRCUIT FOR NON-THRESHOLD LOGIC CIRCUIT

BACKGROUND OF THE INVENTION

1. Field of the Invention

The present invention relates to a semiconductor integrated circuit device, and more particularly, to a power supply circuit which is arranged on the same chip as a non-threshold logic (NTL) circuit and which supplies power to the NTL circuit such that the NTL gate circuits in the NTL circuit can operate stably.

2. Description of Related Art

A conventional non-threshold logic (NTL) circuit is supplied with a voltage between a power supply line on a high voltage VCC side and a line on a low voltage GND side, as shown in FIG. 1. FIG. 2 illustrates a part of the NTL circuit of FIG. 1 in which two stages of NTL inverter circuits 111 and 112 are connected in series. The operation will be described below. When a voltage $V_{IN}$ of a high level is inputted to a first stage of NTL inverter circuit 111, an NPN bipolar transistor T101 is turned on, so that a voltage obtained by subtracting base-emitter forward direction bias $V_{BE}$ from the inputted voltage $V_{IN}$ is applied to a resistor R102 having the resistance of $r_1$. Accordingly, the current I flowing through the NPN bipolar transistor T101 is given as follows.

$$I=(V_{IN}-V_{BE})/r_1$$

Thus, the following voltage drop V is generated at a resistor R101 having the resistance $r_2$.

$$V=(r_2/r_1)\times(V_{IN}-V_{BE})$$

Accordingly, the following voltage of a low level is outputted from an emitter follower circuit 101 of the first stage of NTL inverter circuit.

$$V_{OL}=V_{CC}-(r_2/r_1)\times(V_{IN}-V_{BE})-V_{BE}$$

where $V_{CC}$ is a power supply voltage from an external power source on the higher voltage side. The voltage $V_{OL}$ is inputted to the second stage 112 of NTL inverter circuit so that an NPN bipolar transistor T103 is turned off. As a result, the second stage of NTL inverter circuit 112 outputs the following output $V_{OH}$ of a high level through an emitter follower circuit 102.

$$V_{OH}=V_{CC}-V_{BE}$$

Next, the operation when the voltage $V_{IN}$ of a low level is inputted to the first stage of NTL inverter circuit 111 will be described below. When the voltage $V_{IN}$ is inputted, since the transistor T101 is turned off, the first stage of NTL inverter circuit 111 outputs the following voltage $V_{OH}$ of a high level from the emitter follower circuit 101.

$$V_{OH}=V_{CC}-V_{BE}$$

The voltage $V_{OH}$ of the high level is inputted to the second stage of NTL inverter circuit 112 such that the NPN bipolar transistor T103 is turned on. The operation of the second stage of NTL inverter circuit 112 at this time is the same as that when the voltage $V_{IN}$ of the high level is inputted to the first stage of NTL inverter circuit 111.

The condition that an NTL gate circuit can operate normally will be described, using the second stage of NTL inverter circuit 112 of FIG. 2. When a voltage of a low level is inputted to the transistor T103 of the second stage of NTL inverter circuit 112, the NPN bipolar transistor T103 must be reliably or completely turned off. If the transistor T103 is not completely turned off, the output of the high level is not precisely outputted, so that the logical swing width is made narrower. Therefore, the voltage $V_{OL}$ needs to satisfy the following equation (1).

$$V_{OL}=V_{CC}-(r_2/r_1)\times(V_{OH}-V_{BE})-V_{BE}<V1<V_{BE} \quad (1)$$

Where V1 is the upper limit of the logic low level in the NTL gate circuit. Here, since $$V_{OH}=V_{CC}-V_{BE},$$

$$V_{CC}-(r_2/r_1)\times(V_{CC}-2V_{BE})-V_{BE}\leqq V1<V_{BE} \quad (2)$$

However, if the input to the second stage of NTL inverter circuit 112 is too low, the timing when the transistor T103 is turned on delays so that the operation speed of the second stage of NTL inverter circuit 112 is decreased. Therefore, the following relation (3) is to be satisfied.

$$0<V2\leqq V_{CC}-(r_2/r_1)\times(V_{CC}-2V_{BE})-V_{BE} \quad (3)$$

where V2 is the lower limit of the logic low level in the NTL gate circuit. In this manner, it is the condition for normal operation of the NTL gate circuit to satisfy the equations (2) and (3) at a time.

$$0<V2<V_{CC}-(r_2/r_1)\times(V_{CC}-2V_{BE})-V_{BE}\leqq V1<V_{BE} \quad (4)$$

Here, $V_{BE}$ takes an extremely stable value because of the characteristics of bipolar transistor and it is made possible to increase the ratio of $r_1$ and $r_2$ with high precision using digital resistors. The digital resistor is obtained by connecting a plurality of basic resistors in series or in parallel such that the total resistance is integral times of the resistance of the basic resistor or 1/(integral times of the resistance of the basic resistor). The ratio of digital resistors is substantially constant regardless of the variation of manufacturing process.

As seen from the equation (4), it is very important to control the voltage $V_{CC}$ supplied externally in order to satisfy the equation (4). The $V_{CC}$ is normally about 2 V and the base-emitter forward direction voltage is about 0.8 to 0.9 V. Therefore, tt is desirable that the upper limit V1 and lower limit V2 takes values in a range of about 0.6 V to 0.7 V.

Since the power supply voltage is supplied externally in the convention NTL gate circuit, there is a problem in that the operation condition of the NTL gate circuit is shifted out of the above-mentioned equations (2) and (3). The operation margin of the NTL gate circuit is small and the allowable range in power supply voltage is about ±0.2 V or below. For instance, assuming that $V_{BE}$=0.9 V, $V_{CC}$=2.1 V and $r_2/r_1$=1.5, the following result is obtained from the equation (2).

$$\begin{aligned} V_{OL} &= 2.1-1.5x(2.1-0.9-0.9)-0.9 \\ &= 0.75<V_{BE} \end{aligned}$$

That is, the equations (1) and (2) are satisfied. However, if the voltage $V_{CC}$ is reduced to 1.8 V, $$\begin{aligned} V_{OL} &= 1.8-1.5x(1.8-0.9-0.9)-0.9 \\ &= 0.9=V_{BE} \end{aligned}$$

That is, the equation (1) is not satisfied. This means that the output of a logic low level in a stage of NTL gate circuit cannot completely turn off the input transistor of the next stage of NTL gate circuit. To further say, this means that the logic high level of the NTL gate circuit is equal to the logic low level thereof so that the NTL gate circuit cannot be normally operated. In this manner, if the power supply voltage $V_{CC}$ is reduced from 2.1 V by 0.3 V, the NTL gate circuit operates erroneously.

Conventional methods for setting a reference voltage in a logic LSI including a non-threshold logic (NTL) circuit and an emiter coupled logic (ECL) circuit are disclosed in Japanese examined Patent Disclosures (JP-B2-Hei4-39805 and JP-B2-Hei4-39806). Technique for using both the NTL circuit and the ECL circuit is disclosed only and the power supply circuit for the NTL circuit is different from the present invention in the structure.

SUMMARY OF THE INVENTION

The present invention has, as an object, to provide a method of regulating internal power supply voltages for an NTL circuit when power supply voltages are supplied externally and a power supply circuit for the method.

In order to achieve an aspect of the present invention, a power supply circuit for a non-threshold logic (NTL) circuit including a plurality of NTL gate circuits, includes a monitoring circuit (22) including a dummy NTL gate circuit which always outputs a logic low voltage, for outputting a monitor voltage associated with the logic low voltage from the dummy NTL gate circuit, the monitor voltage representing a voltage variation between an NTL lower voltage on an NTL higher power supply line (6) and an external higher voltage as an NTL higher voltage on an external higher power supply line as an NTL higher power supply line (2) in relation to an external lower voltage on an external lower power supply line (4), a reference circuit (24) for outputting a reference voltage; and a comparing and regulating circuit (26; 28) for comparing the monitor voltage from the monitoring circuit (22) and the reference voltage from the reference circuit (24), and for regulating the NTL lower voltage in accordance with the comparing result such that the NTL lower voltage is equal to a predetermined voltage.

It is desirable that the dummy NTL gate circuit included in the monitor circuit has the same circuit constants as those of each of NTL gate circuits in the NTL circuit and the dummy NTL gate circuit may be an NTL inverter circuit. The power supply circuit and the NTL circuit are formed on the same chip, the regulated voltage is stable against variation of temperature.

The monitoring circuit desirably includes a first bipolar transistor (T1) having a collector connected to the NTL higher power supply line (2), a base connected to the NTL higher power supply line (2) through a first resistor (R1), and an emitter connected to the NTL lower power supply line (6) through a second resistor (R2), a second bipolar transistor (T2) having a collector connected to the NTL higher power supply line (2) through a third resistor (R3), a base connected to the first transistor emitter, and an emitter connected to the NTL lower power supply line (6) through a fourth resistor (R4), and a third bipolar transistor (T3) having a collector connected to the NTL higher power supply line (2), a base connected to the second transistor collector, and an emitter connected to the NTL lower power supply line (6) through a fifth resistor (R5). The voltage at the third transistor emitter is the monitor voltage, and the third and fourth resistors (R3 and R4) have resistance of r1 and r2, respectively, and the monitor voltage is proportional with a coefficient of (r1/r2) to the voltage variation between the NTL higher voltage and the NTL lower voltage.

The reference circuit desirably includes a constant current source (12) connected to the NTL higher power supply line (2), for supplying a constant current, a diode (D1) having an anode connected to the constant current source (12), a fourth bipolar transistor (T4) having connected to the constant current source (12), a base connected to a cathode of the diode (d1), and an emitter connected to the NTL lower power supply line (6), and sixth and seventh resistors (R6 and R7) connected in series between the cathode of the diode (D1) and the NTL lower power supply line (6) and respectively having resistances of r6 and r7. In this case, the voltage at a node between the sixth and seventh resistors (R6, R7) is the reference voltage. If a forward direction voltage between the base and the emitter of the fourth transistor (T4) is substantially equal to that of each of transistors of the NTL circuit (14), and/or if the constant current is substantially equal to a collector current of an output transistor of each of NTL gates circuits in the NTL circuit (14), the NTL lower voltage can be stabilized with a high precision.

The comparing and regulating circuit desirablly includes a differential operational amplifier (16) for comparing the monitor voltage from the monitoring circuit (22) and the reference voltage from the reference circuit (24) to output a control voltage in accordance with a difference between the monitor voltage and the reference voltage, and a MOS transistor (NMOS) for regulating the NTL lower voltage in accordance with the control voltage such that the NTL lower voltage is equal to the predetermined voltage. In this case, the voltage $V_{EE}$ can be regulated even when voltage difference between the voltage $V_{EE}$ and voltage GND is small. Alternatively, the comparing and regulating circuit may include a differential operational amplifier (16) for comparing the monitor voltage from the monitoring circuit and the reference voltage from the reference voltage circuit to output a control voltage in accordance with a difference between the monitor voltage and the reference voltage, an eighth resistor (R10) connected between the output of the differential operational amplifier (16) and the external lower power supply line (4), and a bipolar transistor (T10) for regulating the NTL lower voltage in accordance with the control voltage such that the NTL lower voltage is equal to the predetermined voltage. In this case, the area required to produce the bipolar transistor (T10) is sufficiently small only.

In order to achieve another aspect of the present invention, a method of regulating NTL higher and lower voltages as power source voltages for a non-threshold logic (NTL) circuit including a plurality of NTL gate circuits, including the steps of:

monitoring a logic low voltage of a dummy NTL gate circuit to output a monitor voltage associated with a voltage variation between an NTL lower voltage and an NTL higher voltage;

generating a reference voltage; and regulating the NTL lower voltage to a predetermined voltage in accordance with a difference between the monitor voltage and the reference voltage.

DESCRIPTION OF THE PREFERRED EMBODIMENTS

The power supply circuit for an LSI of NTL gate circuits according to the present invention will be described below with reference to the accompanying drawings.

Figure 1:
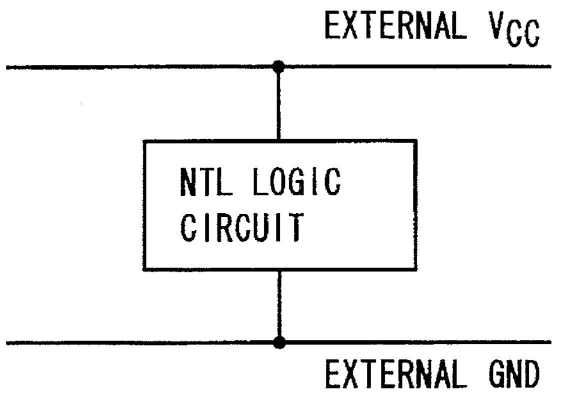
Fig. 1 PRIOR ART
FIG. 1 is a diagram of conventional connection between an NTL gate circuit and power source voltage lines.
Figure 2:
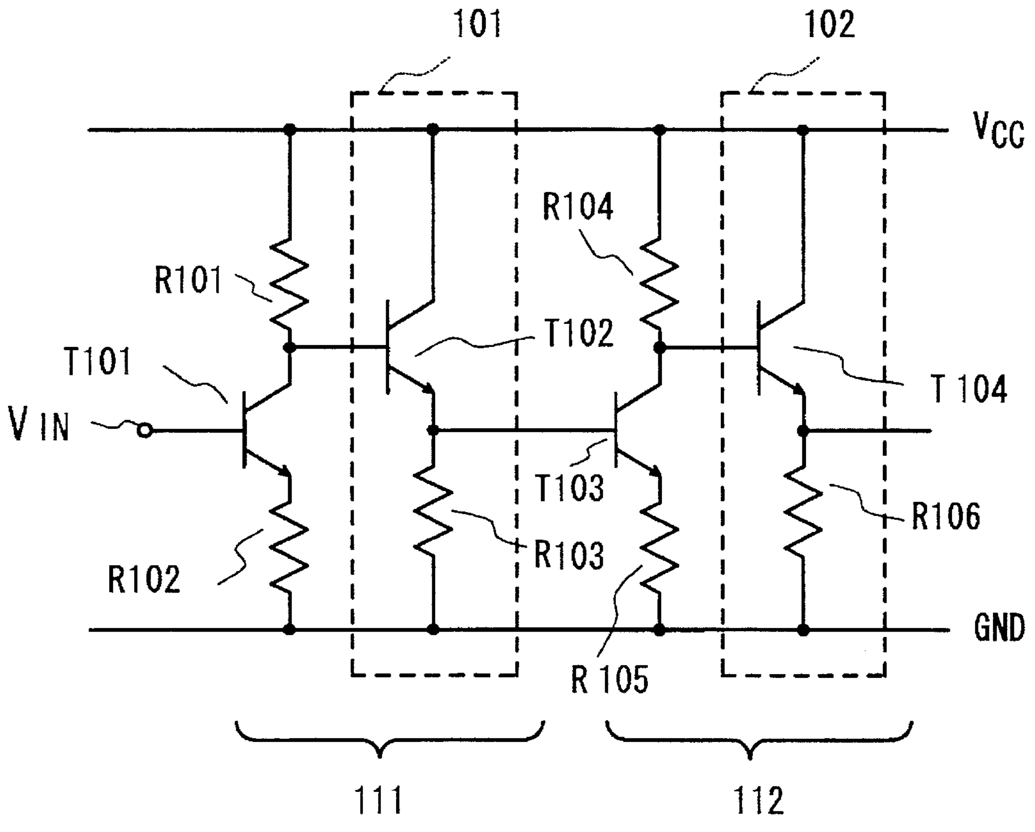
Fig. 2 PRIOR ART
FIG. 2 is a circuitry diagram of an NTL gate circuit in which two NTL inverter circuits are connected in series in a two-stage manner.
Figure 3:
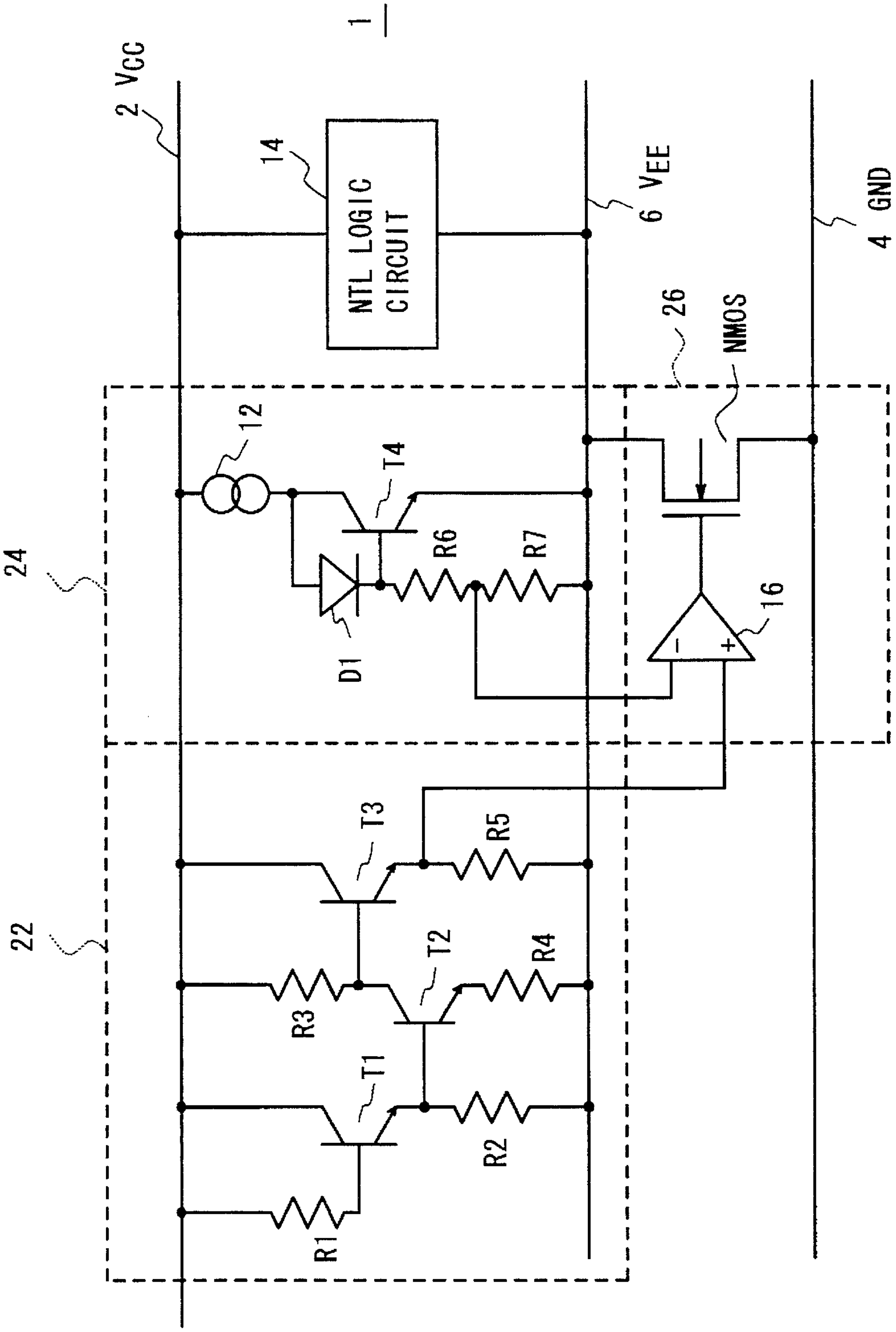
FIG. 3 is a block diagram showing a power supply circuit for an LSI of NTL gates circuits according to a first embodiment of the present invention.

FIG. 3 is a block diagram showing a power supply circuit 1 for an LSI of NTL gates circuits according to a first embodiment of the present invention. Referring to FIG. 3, in the power supply circuit 1 of the present invention, a higher and lower voltages $V_{CC}$ and GND are externally supplied by power supply lines 2 and 4, respectively. The power supply circuit 1 further includes an internal power supply line 6 for supplying a voltage $V_{EE}$ controlled between the voltages $V_{CC}$ and GND. A voltage monitoring circuit 22 for providing a logic low level of an NTL gate circuit to be monitored and a reference voltage circuit 24 for providing a reference voltage are provided between the voltage VEE and a voltage ($V_{EE}$+$V_{BE}$). A compare and control circuit 26 is provided between the power supply lines 4 and 6 and receives the monitor voltage from the voltage monitoring circuit 22 and the reference voltage from the reference voltage circuit 24 to control the voltage $V_{EE}$ of the power supply line 6 in accordance with the difference between both the voltages. An NTL logic gate circuit 14 is provided between the $V_{CC}$ power supply line 2 and the $V_{EE}$ power supply line 6.

In the voltage monitoring circuit 22, an NPN bipolar transistor T1 is provided to have the collector connected to the $V_{CC}$ power supply line 2, a base connected to the $V_{CC}$ power supply line 2 through a resistor R1, and an emitter connected to the $V_{EE}$ power supply line 6 through a resistor R2. An NPN bipolar transistor T2 is provided to have a collector connected to the $V_{CC}$ power supply line 2 through a resistor R3, a base directly connected to a node between the emitter of the transistor T1 and the resistor R2, and an emitter connected to the $V_{EE}$ power supply line 6 through a resistor R4. An NPN bipolar transistor T3 is provided to have a collector connected to the $V_{CC}$ power supply line 2, a base directly connected to a node between the collector of the transistor T2 and the resistor R3, and an emitter connected to the $V_{EE}$ power supply line 6 through a resistor R5.

Figure 5:
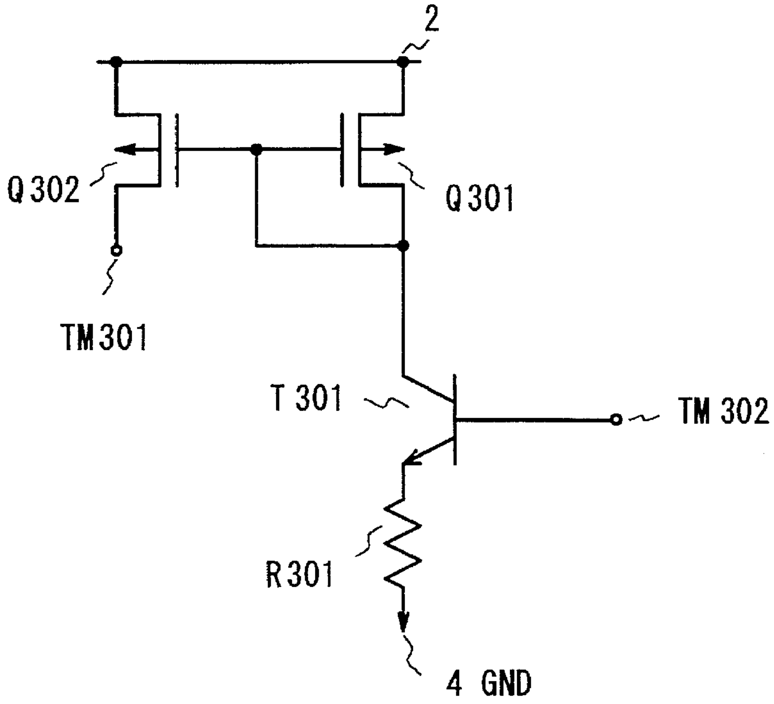
FIG. 5 is a diagram showing an example of a constant current source used in the power supply circuit of FIG. 3.

The reference potential circuit 24 includes a constant current source 12 connected to the $V_{CC}$ power supply line 2, an NPN bipolar transistor T4 having the collector connected to the current source 12 and the emitter connected to the $V_{EE}$ power supply line 6, a diode D1 provided between the current source 12 and the base of the transistor T4 to have an anode connected to the current source 12, resistors R6 and R7 connected in series between the node of the cathode of the diode D1 and the base of the transistor T4 and the $V_{EE}$ power supply line 6. FIG. 5 shows the detail of constant current source 12. Referring to FIG. 5, a P-channel MOS transistor Q302 is provided between the $V_{CC}$ power supply line 2 and an output terminal TM301 and a P-channel MOS transistor Q301 is provided between the $V_{CC}$ power supply line 2 and the collector of an NPN bipolar transistor T301. The gates of the P-channel MOS transistors Q301 and Q302 are connected to each other, and a common node is connected to the node between the transistors Q301 and T301. A reference potential $V_0$ is inputted to the base of the transistor T301 from an input terminal TM302 and the emitter thereof is connected to the GND power supply line 4 through a resistor R301. The collector current of the transistor T301 which is defined by the potential $V_0$ is reflected by a current mirror circuit constituted of the P-channel MOS transistors Q301 and Q302 and the reflected current from the output terminal TM301 is used as constant current.

Figure 4:
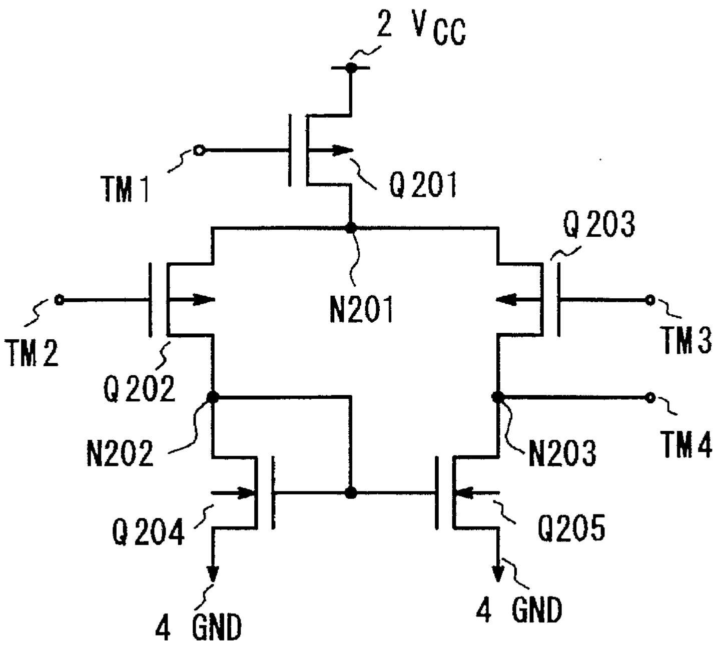
FIG. 4 is a diagram showing an example of a differential operational amplifier used in the power supply circuit of FIG. 3.

The compare and control circuit 26 includes a differential operational amplifier 16 and an N-channel MOS transistor NMOS provided between the $V_{EE}$ power supply line 6 and GND power supply line 4. One of two input of the amplifier 16 receives the monitored voltage from the node between the emitter of the transistor T3 and the resistor R5 in the voltage monitoring circuit 22 and the other receives the reference potential from the node between of the resistors R6 and R7 in the reference potential circuit 24. The output of the amplifier 16 is connected to the gate of the MOS transistor NMOS. FIG. 4 shows the detail of the differential operational amplifier 16. Referring to FIG. 4, a P-channel MOS transistor Q201 is provided between the $V_{CC}$ power supply line 2 and a node N201 and a reference potential $V_0$ is supplied from an input terminal TM1 to the gate. A P-channel MOS transistor Q202 and an N-channel MOS transistor Q204 are connected in series between the node N201 and the GND power supply line 4. Also, a P-channel MOS transistor Q203 and an N-channel MOS transistor Q205 are connected in series between the node N201 and the GND power supply line 4. Input signals are supplied to the gates of the MOS transistors Q202 and Q203 from input terminals TM2 and TM3, respectively. The gates of the MOS transistors Q204 and Q205 are connected to each other and it is connected to a node between the transistors Q202 and Q204. A node between the transistors Q203 and Q205 is connected to an output terminal TM4.

Next, the operation of the power supply circuit according to the first embodiment of the present invention will be described below.

The output voltage from an emitter follower circuit constituted of the resistor R1, the transistor T1 and the resistor R2 is equal to ($V_{CC}$−$V_{BE}$) and this voltage is inputted to the NPN transistor T2. Assuming that the voltage on the power supply line 6 is equal to $V_{EE}$, a voltage ($V_{CC}$−$V_{BE}$−$V_{BE}$−$V_{EE}$) is applied to the resistor R4 having a resistance of $r_1$. Therefore, the voltage drop in the resistor R3 having a resistance of $r_2$ is given by the following equation (5).

$$(r_2/r_1)\times(V_{CC}-2V_{BE}-V_{EE}) \quad (5)$$

The voltage at the output node of the emitter follower circuit composed of the bipolar transistor T3 and the resistor R5 is given by the following equation (6).

$$V_{CC}-(R_2/R_1)\times(V_{CC}-2V_{BE}-V_{EE})-V_{BE} \quad (6)$$

If the circuit constants of NPN bipolar transistors T1, T2 and T3 and resistors R1 to R5 are the same as those of transistors and resistors used actually in an NTL circuit 14, the output voltage is equal to low output voltage of an NTL gate (inverter) circuit.

A collector current defined by the constant current source 12 flows into the NPN bipolar transistor T4. The forward direction voltage between the base and the emitter of the transistor T4 at this time is divided by the resistors R6 and R7 and an intermediate voltage between the voltage $V_{EE}$ and the voltage ($V_{EE}+V_{EE}$) is outputted as a reference voltage. Assuming that the resistors R6 and R7 have the resistance of r6 and r7, respectively, the reference voltage is given by the following equation (7).

$$V_{EE}+V_{BE}\times r7\times(r6+r7) \qquad (7)$$

The two inputs of the differential operational amplifier 16 are coupled to a node between the transistor T3 and the resistor R5 and a node between the resistors R6 and R7 to receive the monitor voltage and the reference voltage. Now assume that the external higher or lower voltages on the external higher or lower voltage power supply line $V_{CC}$ or GND is varied so that the NTL lower voltage $V_{EE}$ on the line 6 is also varied. In this case, since the voltage across the resistor R4 is decreased, the current flowing through the resistor R3 and the transistor T2 is also decreased, so that the output voltage of the emitter follower circuit as the monitor voltage is increased. The ratio of increase is (r2/r1) times of the variation of the voltage $V_{EE}$ from the equation (6). On the other hand, the variation of the reference voltage as the voltage at the node between the resistors R6 and R7 which voltage is determined by dividing the voltage $V_{BE}$ with the ratio of resistors is substantially equal to the increase of the voltage $V_{EE}$. Therefore, the voltage difference is generated at the input of differential operational amplifier 16 so that the output is increased. As a result, the voltage between the gate and source of the N-channel MOS transistor NMOS is increased such that the impedance between the source and drain of the MOS transistor NMOS is decreased, resulting in decreasing the voltage $V_{EE}$. The voltage $V_{EE}$ is regulated to a predetermined voltage through such a negative feed-back operation. When the voltage $V_{EE}$ is decreased, the similar operation is also executed such that voltage $V_{EE}$ is regulated to the predetermined voltage. In this manner, the voltage $V_{EE}$ is always kept to be in the predetermined voltage, i.e., the voltage $V_{EE}$.

As the factors of variation of the voltage $V_{EE}$ there are the variation of power source current when the logic level is changed in the NTL circuit 14 which is connected to the power supply lines 2 and 6 as the load, and the voltage variation of external supply voltages $V_{CC}$ and GND. Further, the temperature variation is also included. In this case, even if the voltage $V_{BE}$ of the transistor T4 is varied, the variation of the voltage $V_{BE}$ is the same in the NPN bipolar transistor T4 and in transistors of each of NTL gate circuits in the NTL circuit 14. Also, the resistance ratio r1/r2 is constant regardless of temperature. Therefore, the condition indicated by the equation (4) is satisfied.

Figure 6:
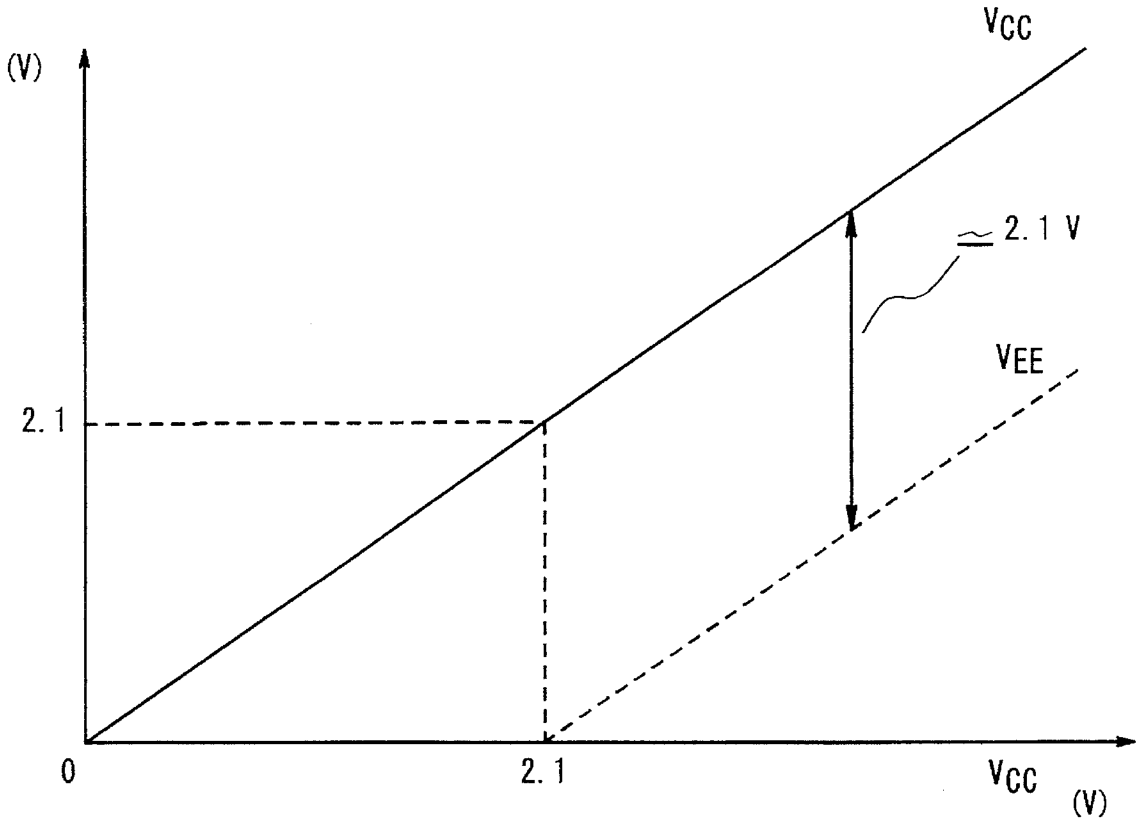
FIG. 6 is a graph showing a relation of power supply voltage $V_{EE}$ to an external power supply voltage $V_{CC}$.

If the constant current of the constant current source 12 is set to be equal to the collector current of an output transistor in the NTL gate circuit, the voltage $V_{BE}$ of the transistor T4 is equal to that of transistors of NTL gate circuits in the NTL circuit 14, so that the voltage $V_{EE}$ can be produced with a higher precision. FIG. 6 shows the dependency of the voltage $V_{EE}$ upon the external supply voltage $V_{CC}$. Note that the constant current source 12 may be replaced by a resistor element. In this case, however, the precision is down but the similar effect can be achieved.

Figure 7:
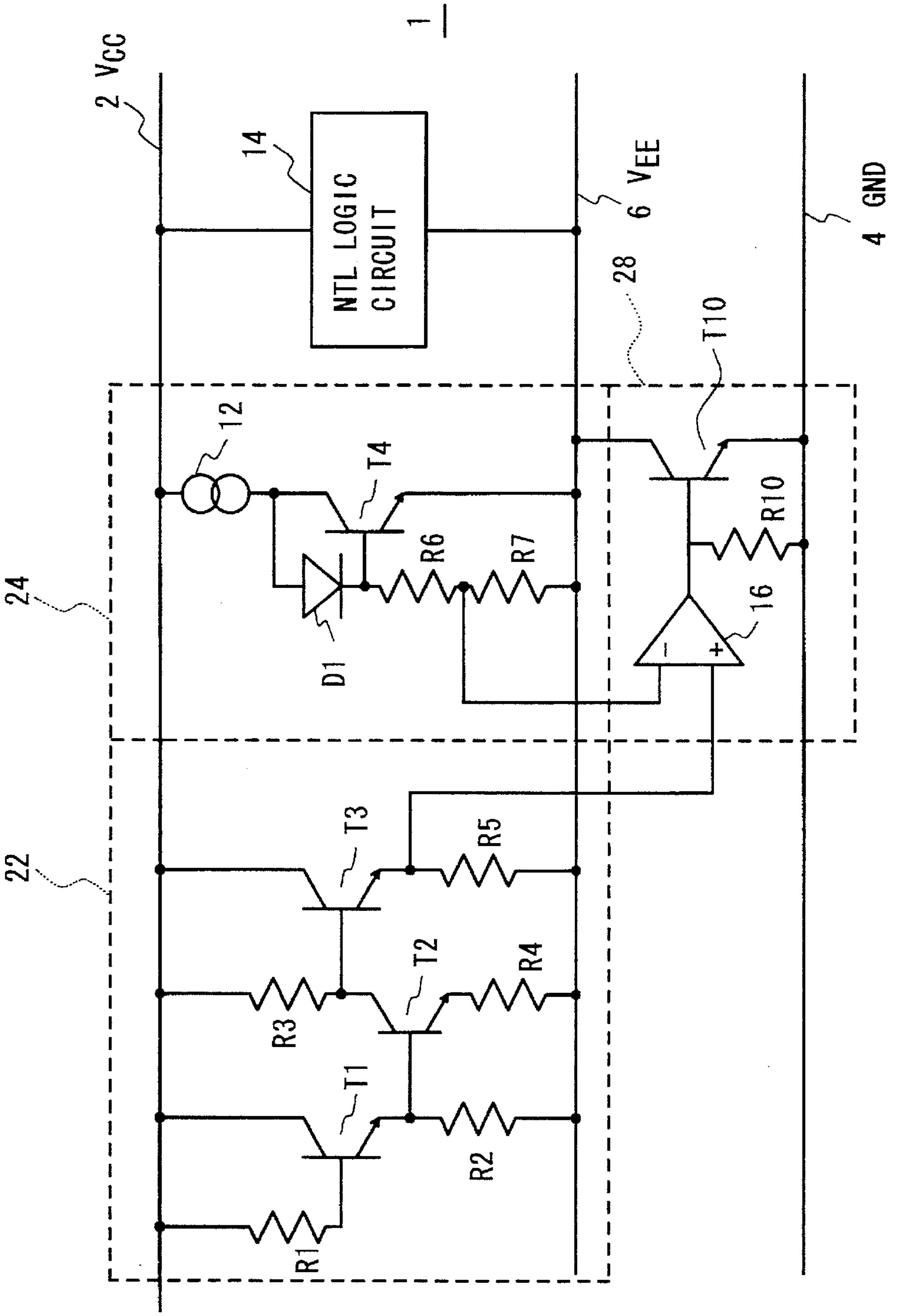
FIG. 7 is a block diagram showing a power supply circuit for an LSI of NTL gates circuits according to a second embodiment of the present invention.

Next, the power supply circuit for the NTL circuit according to the second embodiment of the present invention will be described with reference to FIG. 7. In the second embodiment, the structure is similar to that in the first embodiment. Accordingly, only the different point will be described. Referring to FIG. 7, in the second embodiment, the N-channel MOS transistor NMOS in the first embodiment is replaced by an NPN bipolar transistor T10 such that the base is connected to the output of the differential operational amplifier 16 and a resistor R10 is added between the base of the transistor T10 and the external lower power supply line 4. The operation is the same as in the first embodiment.

In the second embodiment, the power supply circuit can be realized with a smaller area than that in the first embodiment because the NPN bipolar transistor T10 has great transconductance compared to that of the N-channel MOS transistor NMOS. However, in the NPN bipolar transistor, the saturation is caused if the voltage between the collector and the emitter is reduced too much, so that the response speed is remarkably down and the current amplification factor is also decreased. Therefore, it is not proper to make small the voltage difference between the power supply lines 6 and 4. Thus, the first embodiment is superior to the second embodiment in operation stability when the external supply voltages are low.

What is claimed is:

1. A power supply circuit for a non-threshold logic (NTL) circuit including a plurality of NTL gate circuits, comprising:

a monitoring circuit for outputting a monitor voltage substantially proportional with a first factor to a voltage variation between an NTL lower voltage on an NTL lower power supply line and an external higher voltage as an NTL higher voltage on an external higher power supply line as an NTL higher power supply line in relation to an external lower voltage on an external lower power supply line;

a reference circuit for outputting a reference voltage substantially proportional with a second factor to said voltage variation; and comparing and regulating means for comparing said monitor voltage from said monitoring circuit and said reference voltage from said reference circuit, and for regulating said NTL lower voltage in accordance with the comparing result such that said NTL lower voltage is equal to a predetermined voltage.

2. A power supply circuit according to claim 1, wherein said monitoring circuit includes an NTL gate circuit which is constituted such that a logic low level is always outputted from said NTL gate circuit and said logic low level is associated with said monitor voltage.

3. A power supply circuit according to claim 2, wherein said NTL gate circuit included in said monitor circuit has the same circuit constants as those of each of NTL gate circuits in said NTL circuit.

4. A power supply circuit according to claim 2, wherein said NTL gate circuit is an NTL inverter circuit.

5. A power supply circuit according to claim 1, wherein said monitoring circuit includes:

a first bipolar transistor having a collector connected to said NTL higher power supply line, a base connected to said NTL higher power supply line through a first resistor, and an emitter connected to said NTL lower power supply line through a second resistor;

a second bipolar transistor having a collector connected to said NTL higher power supply line through a third resistor, a base connected to said first transistor emitter, and an emitter connected to said NTL lower power supply line through a fourth resistor; and a third bipolar transistor having a collector connected to said NTL higher power supply line, a base connected to said second transistor collector, and an emitter connected to said NTL lower power supply line through a fifth resistor, and wherein a voltage at said third transistor emitter is said monitor voltage, and wherein said third and fourth resistors have resistance of r1 and r2, respectively, and said monitor voltage is proportional with a coefficient of (r1/r2) to said voltage variation between said NTL higher voltage and said NTL lower voltage.

6. A power supply circuit according to claim 1, wherein said reference circuit includes:

a constant current source connected to said NTL higher power supply line, for supplying a constant current;

a diode having an anode connected to said constant current source;

a fourth bipolar transistor having connected to said constant current source, a base connected to a cathode of said diode, and an emitter connected to said NTL lower power supply line; and sixth and seventh resistors connected in series between said cathode of said diode and said NTL lower power supply line and respectively having resistances of r6 and r7, and wherein a voltage at a node between said sixth and seventh resistors is said reference voltage.

7. A power supply circuit according to claim 6, wherein a forward direction voltage between said base and said emitter of said fourth transistor is substantially equal to that of each of transistors of said NTL circuit.

8. A power supply circuit according to claim 6, wherein said constant current is substantially equal to a collector current of an output transistor of each of NTL gates circuits in said NTL circuit.

9. A power supply circuit according to claim 1, wherein said comparing and regulating means includes:

a differential operational amplifier for comparing said monitor voltage from said monitoring circuit and said reference voltage from said reference circuit to output a control voltage in accordance with a difference between said monitor voltage and said reference voltage; and a MOS transistor for regulating said NTL lower voltage in accordance with said control voltage such that said NTL lower voltage is equal to the predetermined voltage.

10. A power supply circuit according to claim 1, wherein said comparing and regulating means includes:

a differential operational amplifier for comparing said monitor voltage from said monitoring circuit and said reference voltage from said reference voltage circuit to output a control voltage in accordance with a difference between said monitor voltage and said reference voltage;

an eighth resistor connected between the output of said differential operational amplifier and said external lower power supply line; and a bipolar transistor for regulating said NTL lower voltage in accordance with said control voltage such that said NTL lower voltage is equal to the predetermined voltage.

11. A power supply circuit according to claim 1, wherein said power supply circuit and said NTL circuit are formed on the same chip.

12. A method of regulating NTL higher and lower voltages as power source voltages for a non-threshold logic (NTL) circuit including a plurality of NTL gate circuits, comprising the steps of:

monitoring a logic low voltage of a dummy NTL gate circuit to output a monitor voltage associated with a voltage variation between an NTL lower voltage and an NTL higher voltage;

generating a reference voltage; and regulating said NTL lower voltage to a predetermined voltage in accordance with a difference between said monitor voltage and said reference voltage.

13. A method according to claim 12, wherein said step of generating a reference voltage includes:

supplying a constant current to a bipolar transistor as a collector current; and outputting a voltage associated with a forward direction voltage between a base and an emitter of said transistor as said reference voltage.

14. A method according to claim 13, wherein said forward direction voltage between said base and said emitter of said transistor is substantially equal to that of each of transistors of said NTL circuit.

15. A method according to claim 13, wherein said constant current is substantially equal to a collector current of an output transistor of each of NTL gates circuits in said NTL circuit.

16. A semiconductor integrated circuit including a non-threshold logic (NTL) circuit including a plurality of NTL gate circuits, comprising:

a dummy NTL gate circuit which always outputs a logic low voltage;

output means for outputting a monitor voltage associated with the logic low voltage from said dummy NTL gate circuit, said monitor voltage representing a voltage variation between an NTL lower voltage and an NTL higher voltage as power supply voltages for the NTL circuit;

a reference circuit for generating a reference voltage; and regulating means for regulating said NTL lower voltage to a predetermined voltage in accordance with a difference between said monitor voltage and said reference voltage.

17. A semiconductor integrated circuit according to claim 16, wherein said reference circuit includes:

a constant current source connected to an NTL higher power supply line for said NTL higher voltage, for supplying a constant current;

a diode having an anode connected to said constant current source;

a bipolar transistor having connected to said constant current source, a base connected to a cathode of said diode, and an emitter connected to an NTL lower power supply line for said NTL lower voltage; and resistors connected in series between said cathode of said diode and said NTL lower power supply line and wherein a voltage at a node between said resistors is said reference voltage.

18. A semiconductor integrated circuit according to claim 17, wherein a forward direction voltage between said base and said emitter of said transistor is substantially equal to that of each of transistors of said NTL circuit.

19. A semiconductor integrated circuit according to claim 17, wherein said constant current is substantially equal to a collector current of an output transistor of each of NTL gates circuits in said NTL circuit.

* * * * *